(12) United States Patent
Kuo

(10) Patent No.: US 7,424,700 B2
(45) Date of Patent: Sep. 9, 2008

(54) METHOD AND SYSTEM FOR SELECTIVE OPTICAL PATTERN COMPENSATION

(75) Inventor: Kuei-Chi Kuo, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 154 days.

(21) Appl. No.: 11/261,455

(22) Filed: Oct. 27, 2005

(65) Prior Publication Data

US 2007/0074144 A1     Mar. 29, 2007

(30) Foreign Application Priority Data

Sep. 28, 2005     (CN) .................. 2005 1 0030306

(51) Int. Cl.
*G06F 17/50* (2006.01)
(52) U.S. Cl. .............. 716/21; 716/19; 430/5; 430/30
(58) Field of Classification Search ............ 716/10, 716/13, 19–21; 250/221; 430/5, 30
See application file for complete search history.

(56) References Cited

U.S. PATENT DOCUMENTS

| | | | |
|---|---|---|---|
| 6,792,593 B2 * | 9/2004 | Takashima et al. ............ 716/21 |
| 7,058,923 B2 * | 6/2006 | Tounai et al. ................ 716/19 |
| 7,065,738 B1 * | 6/2006 | Kim ............................ 716/19 |
| 2002/0043615 A1 * | 4/2002 | Tounai et al. ................ 250/221 |
| 2003/0005390 A1 * | 1/2003 | Takashima et al. ............. 716/1 |
| 2003/0115569 A1 * | 6/2003 | Ikeuchi ........................ 716/19 |
| 2004/0210862 A1 * | 10/2004 | Igarashi et al. ................ 716/13 |
| 2005/0166176 A1 * | 7/2005 | Watanabe et al. ............. 716/21 |
| 2006/0195809 A1 * | 8/2006 | Cohn et al. ................... 716/10 |

* cited by examiner

*Primary Examiner*—Paul Dinh
*Assistant Examiner*—Nha T Nguyen
(74) *Attorney, Agent, or Firm*—Townsend and Townsend and Crew LLP

(57) ABSTRACT

A method and system for making a photographic mask. The method includes determining a first contact area, processing information associated with the first contact area, and determining whether a first optical compensation should be applied to the first contact area based on at least information associated with the first contact area. Additionally, the method includes if the first optical compensation should be applied to the first contact area, applying the first optical compensation to the first contact area, processing information associated with first optical compensation, determining a first distance between the first optical compensation and a second optical compensation or a second contact area, processing information associated with the first distance, and adjusting the first optical compensation based on at least information associated with the first distance.

8 Claims, 16 Drawing Sheets

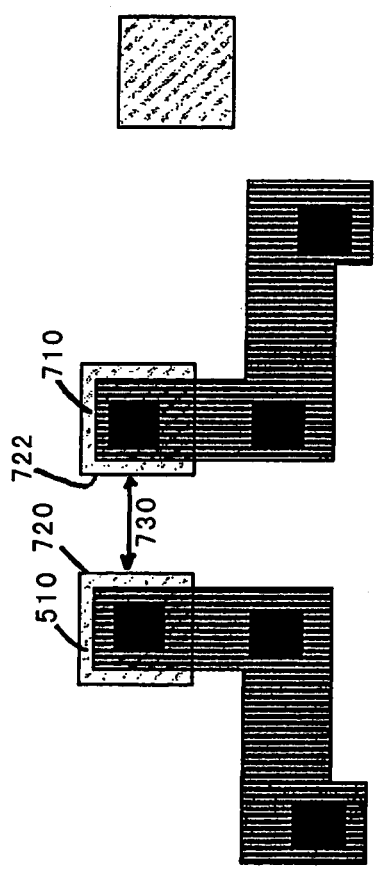
FIG.7  M1_OPC3 = EXT [M1_OPC2] < V4
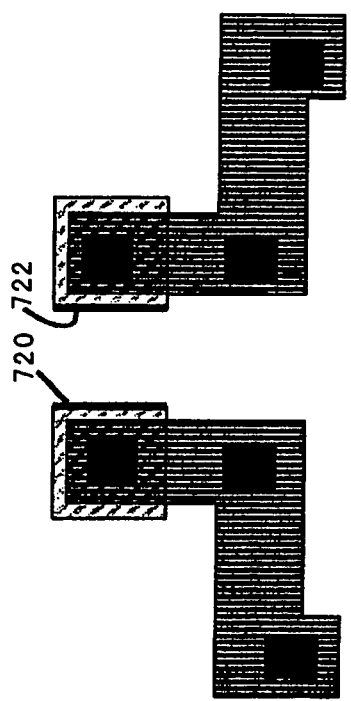
FIG.8  M1_OPC4 = M1_OPC1 TOUCH EDGE M1_OPC3

▬ M1_OPC5 = EXPAND EDGE M1_OPC4 INSIDE BY V5

FINM1=M1_OPC1 NOT M1_OPC5

M1_A=M1 OR FINM1 (former hole)
M1_B=M1 OR FINM2 (later hole)
M1_OPCOUT=M1_A OR M1_B

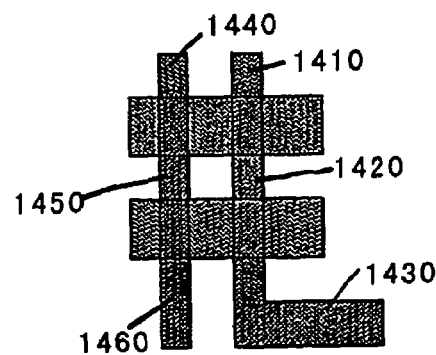  PEAC_B = Area PEAC_C <V2
FIG.15
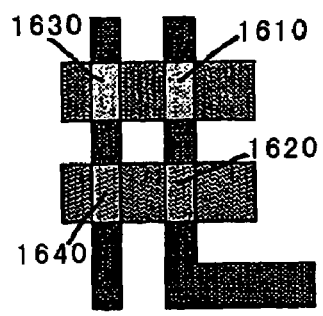  PEAC_C = P1 AND OD1
FIG.16
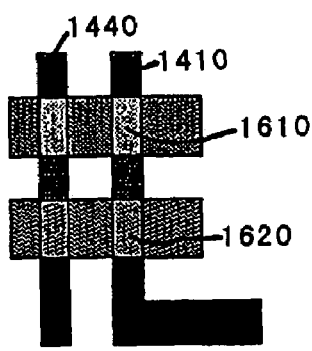  PEAC_D = PEAC_B Touch PEAC_C =1
FIG.17

■ A = All Holes (OPC Layer)

▦ B = External A{
    Space < P1 }

Ps. P1 = 0.7

▨ C = A Touching B

■ D = A NOT C

◩ E = A Touching B{
    Range=[1,P2]}

Ps. P2 = 2

Hole sizing pattern =I+J+K

METHOD AND SYSTEM FOR SELECTIVE OPTICAL PATTERN COMPENSATION

CROSS-REFERENCES TO RELATED APPLICATIONS

This application claims priority to Chinese Patent Application No. 200510030306.2, filed Sep. 28, 2005, commonly assigned, incorporated by reference herein for all purposes.

BACKGROUND OF THE INVENTION

The present invention is directed to integrated circuits and their processing for the manufacture of semiconductor devices. More particularly, the invention provides a method and system for optical pattern compensation for the manufacture of integrated circuits. Merely by way of example, the invention has been applied to photolithographic masks for the manufacture of integrated circuits. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is photographical masks used for the manufacture of integrated circuits in a cost effective and efficient way.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor International Manufacturing Company (SMIC) of Shanghai, China is an example of a chip company that performs foundry services. Although fabless chip companies and foundry services have increased through the years, many limitations still exist. For example, photolithography is limited by optical diffraction and other effects. These and other limitations are described throughout the present specification and more particularly below.

From the above, it is seen that an improved technique for processing semiconductor devices is desired.

BRIEF SUMMARY OF THE INVENTION

The present invention is directed to integrated circuits and their processing for the manufacture of semiconductor devices. More particularly, the invention provides a method and system for optical pattern compensation for the manufacture of integrated circuits. Merely by way of example, the invention has been applied to photolithographic masks for the manufacture of integrated circuits. But it would be recognized that the invention has a much broader range of applicability.

In a specific embodiment, the invention provides a method for making a photographic mask. The method includes determining a first contact area, processing information associated with the first contact area, and determining whether a first optical compensation should be applied to the first contact area based on at least information associated with the first contact area. Additionally, the method includes if the first optical compensation should be applied to the first contact area, applying the first optical compensation to the first contact area, processing information associated with first optical compensation, determining a first distance between the first optical compensation and a second optical compensation or a second contact area, processing information associated with the first distance, and adjusting the first optical compensation based on at least information associated with the first distance. The processing information associated with the first contact area includes determining a plurality of distances from a first plurality of boundaries of the first contact area to a second plurality of boundaries of a conductive area, processing information associated with the plurality of distances, determining a plurality of areas associated with the plurality of distances respectively, and processing information associated with the plurality of areas. The determining whether a first optical compensation should be applied to the first contact area is performed based on at least information associated with the plurality of distances and the plurality of areas.

In another specific embodiment of the present invention, a method for making a photographic mask includes determining a first conductive area and a first extended area, processing information associated with the first conductive area and the first extended area, determining a second conductive area based on at least information associated with the first conductive area and the first extended area, determining a second extended area based on at least information associated with the first conductive area and the first extended area, processing information associated with the second conductive area and the second extended area, and determining whether a first optical pattern compensation should be applied to the second conductive area. Additionally, the method includes if the first optical pattern compensation should be applied to the second conductive area, applying the first optical compensation to the second conductive area, processing information associated with first optical compensation, determining a first distance between the first optical compensation and a second optical compensation or a third conductive area, processing information associated with the first distance, and adjusting the first optical compensation based on at least information associated with the first distance. The first extended area includes a first active area and a protective area. The protective area surrounds the first active area and is free from being a part of a photolithographic mask. The determining whether a first optical pattern compensation should be applied to the second conductive area is performed based on at least information associated with the second conductive area and the second extended area.

In yet another specific embodiment of the present invention, a method for making a photographic mask includes determining a first contact area and at least one neighboring contact area, processing information associated with the first contact area and the at least one neighboring contact area, classifying the first contact area into one of a plurality of categories, and applying a first optical pattern compensation to the first contact area based on at least information associated with the first contact area and the at least one neighboring contact area. The classifying the first contact area is performed based on at least information associated with at least a first distance between the first contact area and the at least one neighboring contact area.

Many benefits are achieved by way of the present invention over conventional techniques. For example, the present technique provides an easy to use process that relies upon conventional technology. The present invention has numerous advantages over conventional techniques. Certain embodiments of the present invention selectively apply optical pattern compensations and reduce the database volume for mask design. Some embodiments of the present invention automatically check the spacing between various mask areas and adjust optical pattern compensations accordingly. The computation requirement for detecting design rule violations is reduced. Certain embodiments of the present invention consider relationship between different layers to select areas for optical pattern compensation. For example, the layers include a metal layer and a via layer, or an active layer and a polysilicon layer. Some embodiments of the present invention provides different optical pattern compensations to different types of contact hole areas. Certain embodiments of the present invention reduce mask conversion and writing time. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 7 and 8 are simplified diagrams for determining spacing according to an embodiment of the present invention;

FIGS. 14 and 15 are simplified diagrams for determining extended areas without polysilicon areas below threshold;

FIG. 16 is a simplified diagram for determining extended areas overlapping with polysilicon areas according to an embodiment of the present invention;

FIG. 17 is a simplified diagram for determining polysilicon areas for optical pattern compensation according to an embodiment of the present invention;

DETAILED DESCRIPTION OF THE INVENTION

The present invention is directed to integrated circuits and their processing for the manufacture of semiconductor devices. More particularly, the invention provides a method and system for optical pattern compensation for the manufacture of integrated circuits. Merely by way of example, the invention has been applied to photolithographic masks for the manufacture of integrated circuits. But it would be recognized that the invention has a much broader range of applicability.

Figure 1:
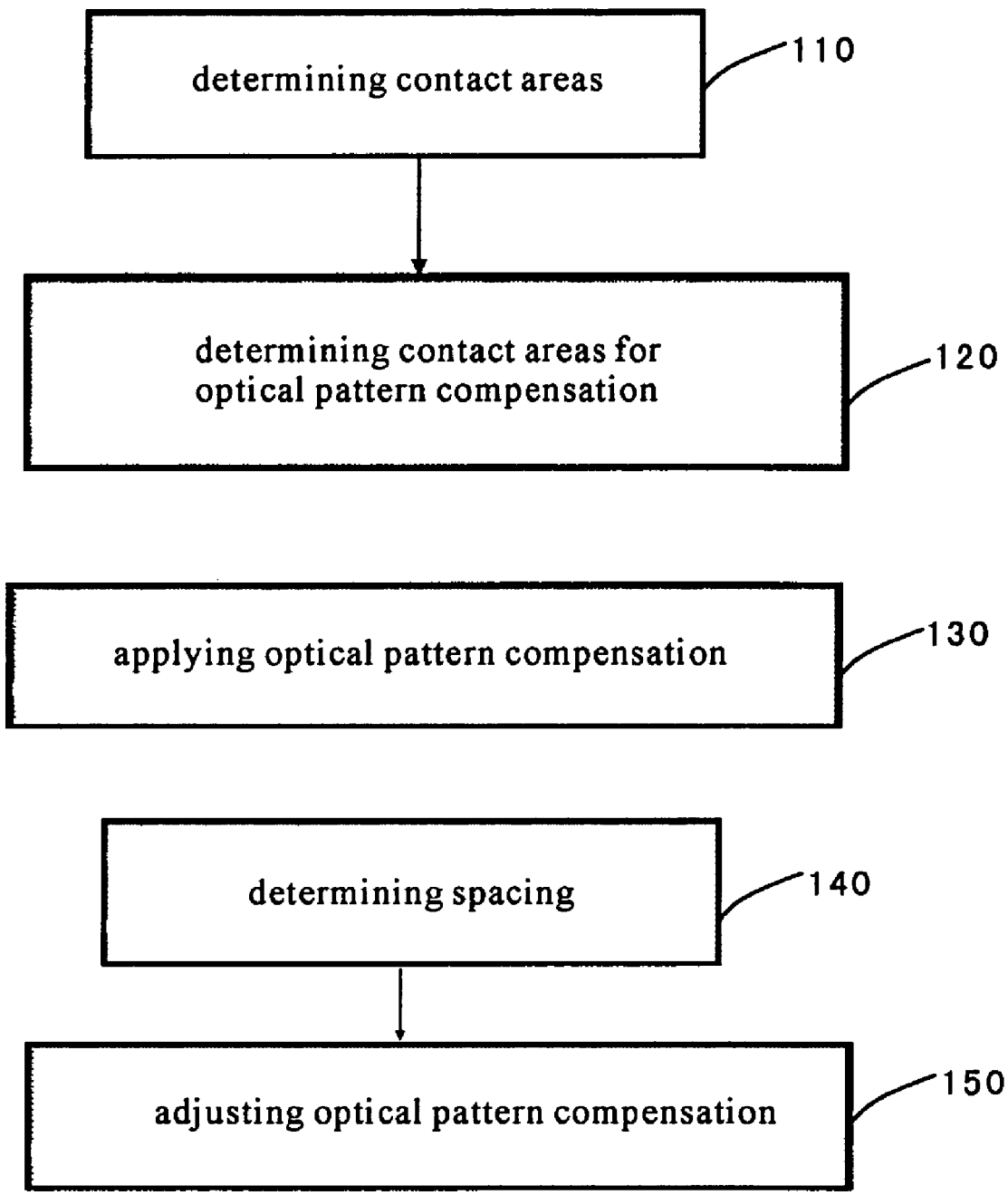
FIG. 1 is a simplified diagram of a method for optical pattern compensation according to an embodiment of the present invention.

FIG. 1 is a simplified diagram of a method for optical pattern compensation according to an embodiment of the present invention. This diagram is merely an example, which should not unduly limit the scope of the claims herein. The method 100 includes the following processes:

1. Process 110 for determining contact areas;
2. Process 120 for determining contact areas for optical pattern compensation;
3. Process 130 for applying optical pattern compensation;
4. Process 140 for determining spacing;
5. Process 150 for adjusting optical pattern compensation.

The above sequence of processes provides a method according to an embodiment of the present invention. Other alternatives can also be provided where processes are added, one or more processes are removed, or one or more processes are provided in a different sequence without departing from the scope of the claims herein. Future details of the present invention can be found throughout the present specification and more particularly below.

Figure 2:
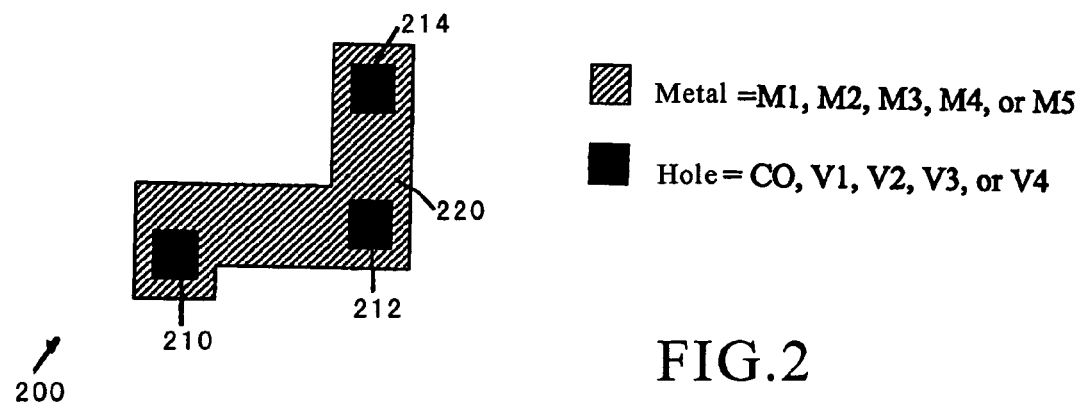
FIG. 2 is a simplified diagram for contact areas and metal areas according to an embodiment of the present invention.

At the process 110, contact areas are located. FIG. 2 is a simplified diagram for contact areas and metal areas according to an embodiment of the present invention. This diagram is merely an example, which should not unduly limit the scope of the claims herein. A photolithographic mask 200 includes contact areas 210, 212 and 214, and a metal area 220. For example, the contact areas 210, 212 and 214 are the areas of a metal area 220 exposed to contact holes or vias. The metal area 220 may form part of metal 1 layer, metal 2 layer, metal 3 layer, metal 4 layer, metal 5 layer, or other metal layer.

Figure 3:
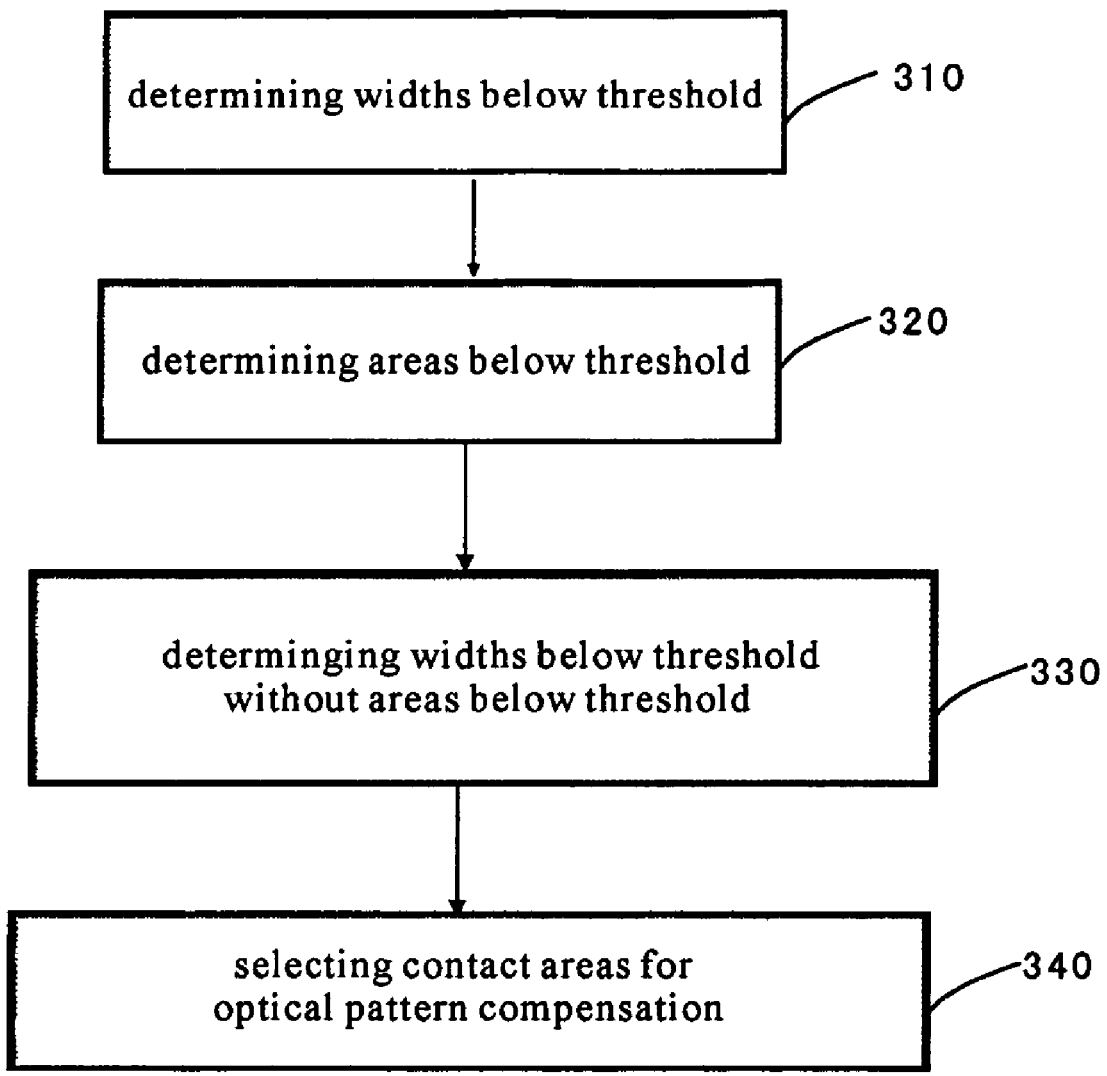
FIG. 3 is a simplified diagram for the process 120 according to an embodiment of the present invention.

At the process 120, contact areas for optical pattern compensation are selected. FIG. 3 is a simplified diagram for the process 120 according to an embodiment of the present invention. This diagram is merely an example, which should not unduly limit the scope of the claims herein. The process 120 includes the following processes:

1. Process 310 for determining widths below threshold;
2. Process 320 for determining areas below threshold;
3. Process 330 for determining widths below threshold without areas below threshold;
4. Process 340 for selecting contact areas for optical pattern compensation.

At the process 310, widths below a width threshold are determined. The widths are measured from the edges of contact areas to the outer edges of the metal area. At the process 320, areas associated with the widths below the width threshold are identified. Among them, the areas that are smaller than an area threshold are identified. At the process 330, the widths below the width threshold that are not associated with any area below the area threshold are identified. At the process 340, contact areas for optical pattern compensation are selected. These contact areas should have at least 3 sides in contact with the widths below the width threshold that are not associated with any area below the area threshold.

Figure 4:
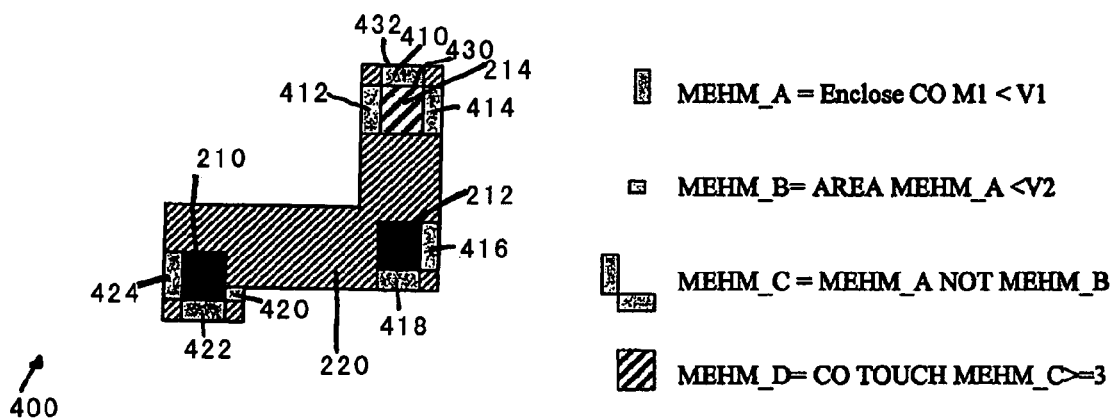
FIG. 4 is a simplified diagram for the process 120 according to an embodiment of the present invention.

FIG. 4 is a simplified diagram for the process 120 according to an embodiment of the present invention. This diagram is merely an example, which should not unduly limit the scope of the claims herein. Areas 410, 412, 414, 416, 418, 420, 422 and 424 each have a width small than a width threshold. The width is measured from an edge of the contact area 210, 212 or 214 to an outer edge of the metal area 220. For example, the area 410 has a width smaller than the width threshold, and the width is measured from an edge 430 to an edge 432. Among the areas 410, 412, 414, 416, 418, 420, 422 and 424, the area 420 has an area smaller than an area threshold. Other areas 410, 412, 414, 416, 418, 422 and 424 are associated with the widths below the width threshold that are not associated with an area below the area threshold. Among the contact areas 210, 212 and 214, the contact area 214 has at least 3 sides in contact with the areas 410, 412 and 414 associated with the widths smaller than the width threshold. The contact area 214 is selected for optical pattern compensation.

Figure 5:
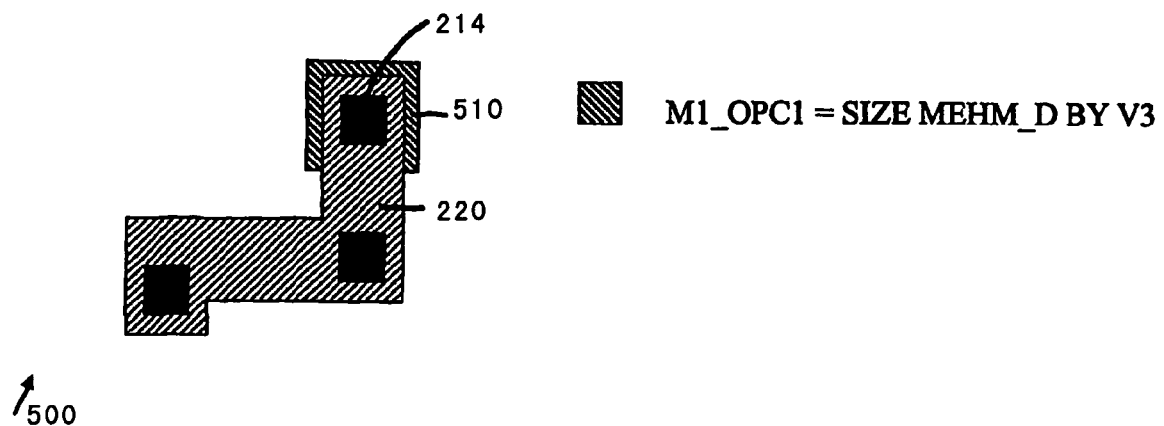
FIGS. 5 and 6 are simplified diagrams for applying optical pattern compensation according to an embodiment of the present invention.
Figure 6:
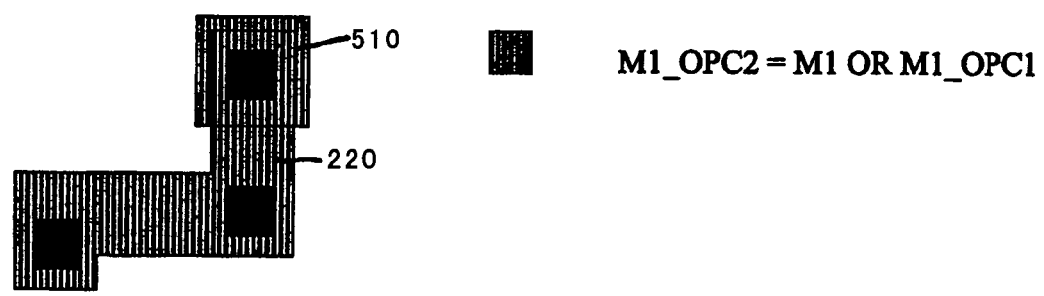

At the process 130, an optical pattern compensation is applied. FIGS. 5 and 6 are simplified diagrams for the process 130 according to an embodiment of the present invention. These diagrams are merely examples, which should not unduly limit the scope of the claims herein. The photolithographic mask 500 includes an optical pattern compensation 510 surrounding the area 214 previously selected for optical pattern compensation. The optical pattern compensation 510 provides a protective layer with a certain width around the contact area 220. The optical pattern compensation 510 is merged with the metal area to form a mask area.

At the process 140, spacing between outer edges of mask areas is determined. For example, a distance between an outer edge of an optical pattern compensation and an outer edge of another optical pattern compensation is determined. As another example, a distance between an outer edge of an optical pattern compensation and an outer edge of the metal area is determined. If a distance is below a spacing threshold, the outer edge of the optical pattern compensation that is associated with the distance below the spacing threshold is selected. FIGS. 7 and 8 are simplified diagrams for the process 140 according to an embodiment of the present invention. These diagram are merely examples, which should not unduly limit the scope of the claims herein. A distance 730 is measured from an outer edge 720 of the optical pattern compensation 510 to an outer edge 722 of another optical pattern compensation 710. If the distance 730 is smaller than a spacing threshold, the outer edges 720 and 722 are selected.

Figure 9:
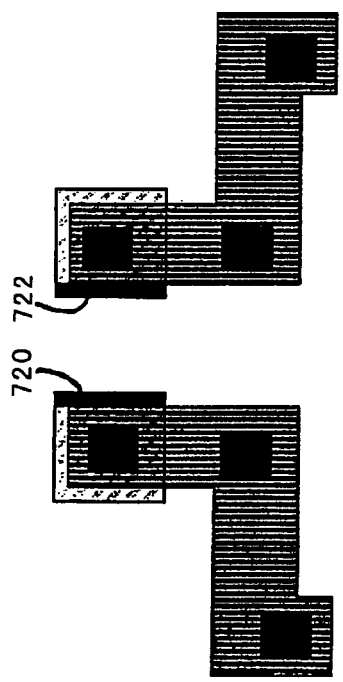
FIGS. 9 and 10 are simplified diagrams for adjusting optical pattern compensation according to an embodiment of the present invention.
Figure 10:
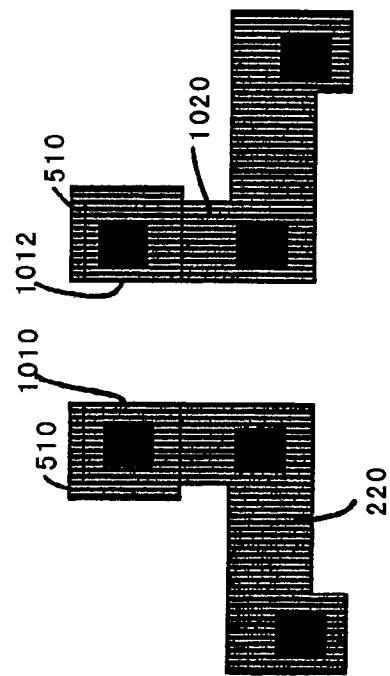

At the process 150, an optical pattern compensation is adjusted if an distance associated with the optical pattern compensation is smaller than a spacing threshold. An outer edge previously selected and associated with the distance below the spacing threshold is adjusted so that the distance increases to meet or exceed the spacing threshold. FIGS. 9 and 10 are simplified diagrams for the process 150 according to an embodiment of the present invention. These diagram are merely examples, which should not unduly limit the scope of the claims herein. The outer edges 720 and 722 are adjusted towards outer edges 1010 and 1012 of the contact areas 220 and 1020 respectively. For example, the adjusted outer edges coincide with the edges 1010 and 1012 respectively. In another example, only one or neither of the adjusted outer edges coincides with the edges 1010 and 1012 respectively.

Figure 11:
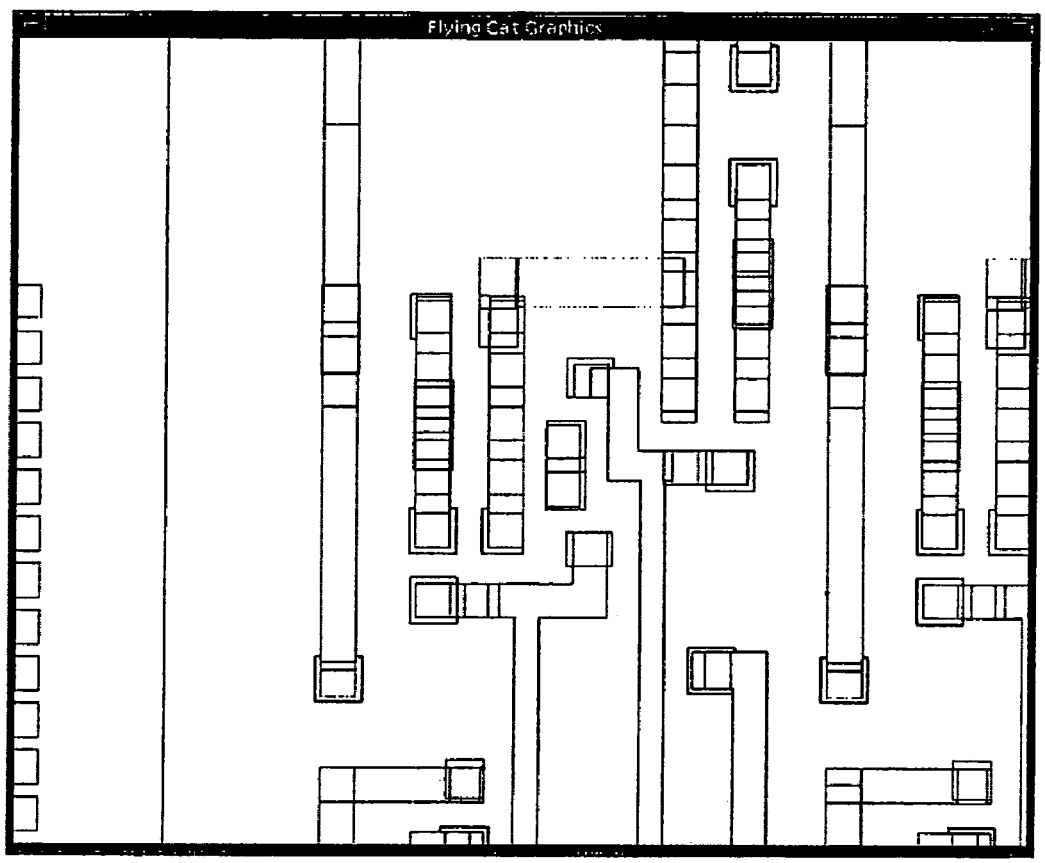
FIG. 11 shows a simplified diagram for a photolithographic mask with optical pattern compensation according to an embodiment of the present invention.

As discussed above and further emphasized here, FIG. 1 is merely an example, which should not unduly limit the scope of the claims herein. An addition process for making an photolithography mask can also be performed. The photolithographic mask includes a metal area and an optical pattern compensation. For example, the photolithographic mask includes the metal area 220 and the optical pattern compensation 510. As another example, FIG. 11 shows a simplified diagram for a photolithographic mask with optical pattern compensation according to an embodiment of the present invention. These diagram are merely examples, which should not unduly limit the scope of the claims herein.

Figure 12:
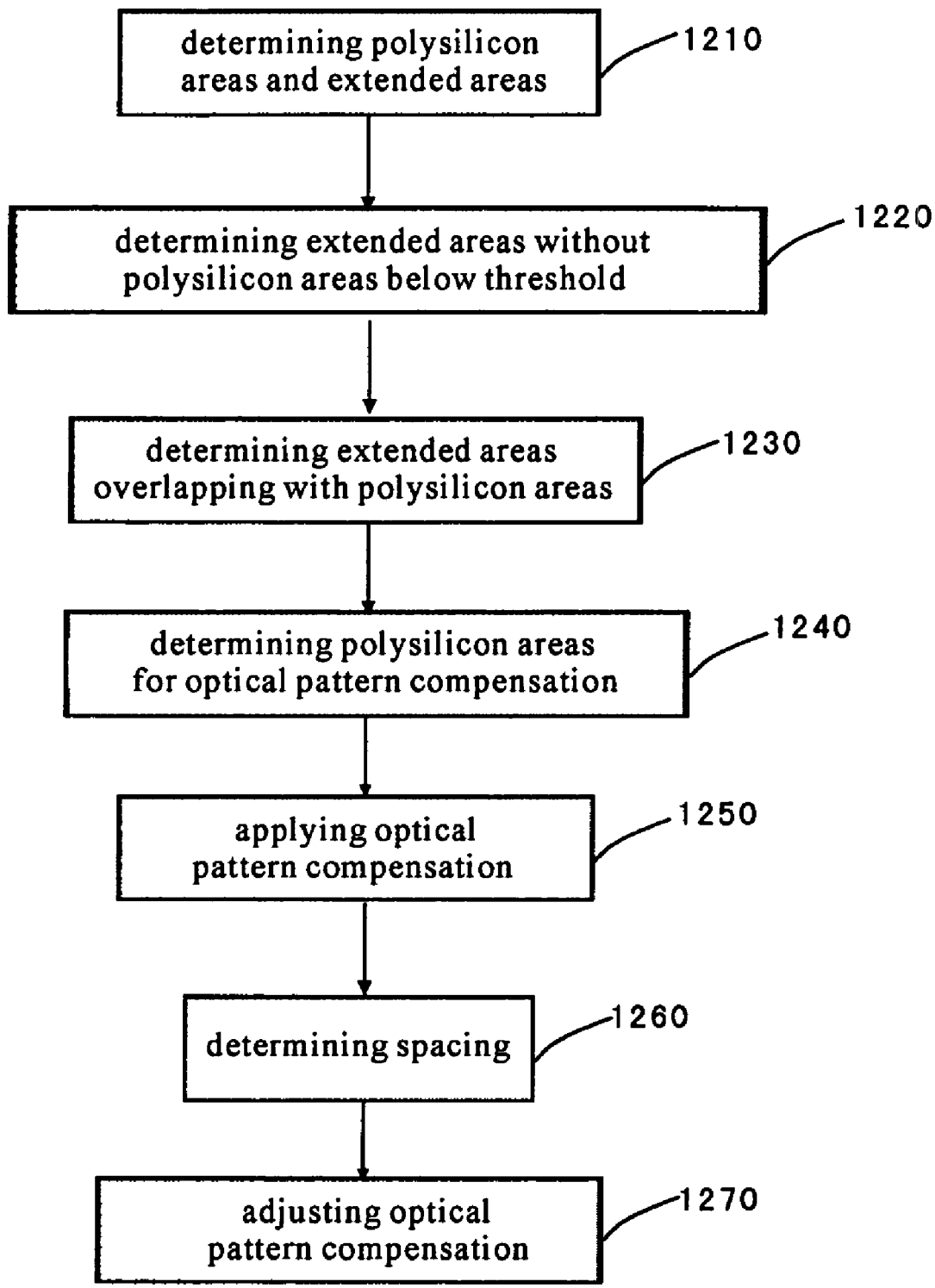
FIG. 12 is a simplified diagram of a method for optical pattern compensation according to another embodiment of the present invention.

FIG. 12 is a simplified diagram of a method for optical pattern compensation according to another embodiment of the present invention. This diagram is merely an example, which should not unduly limit the scope of the claims herein. The method 1200 includes the following processes:

1. Process 1210 for determining polysilicon areas and extended areas;
2. Process 1220 for determining extended areas without polysilicon areas below threshold;
3. Process 1230 for determining extended areas overlapping with polysilicon areas;
4. Process 1240 for determining polysilicon areas for optical pattern compensation;
5. Process 1250 for applying optical pattern compensation;
6. Process 1260 for determining spacing;
7. Process 1270 for adjusting optical pattern compensation.

The above sequence of processes provides a method according to an embodiment of the present invention. Other alternatives can also be provided where processes are added, one or more processes are removed, or one or more processes are provided in a different sequence without departing from the scope of the claims herein. Future details of the present invention can be found throughout the present specification and more particularly below.

Figure 13:
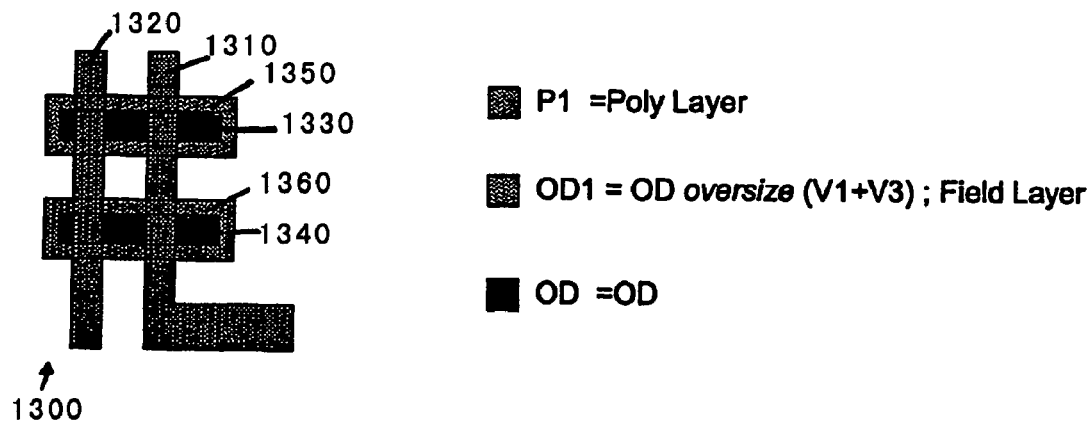
FIG. 13 is a simplified diagram for polysilicon areas and extended areas according to an embodiment of the present invention.

At the process 1210, polysilicon areas and extended areas are determined. FIG. 13 is a simplified diagram for polysilicon areas and extended areas according to an embodiment of the present invention. This diagram is merely an example, which should not unduly limit the scope of the claims herein. A photolithographic mask 1300 includes polysilicon areas 1310 and 1320, and active areas 1330 and 1340. Extended areas 1350 and 1360 include the active areas 1330 and 1340 respectively and additional layers surrounding the active areas 1330 and 1340 respectively. For example, the extended area 1350 includes an additional layer surrounding the polysilicon layer 1330. The polysilicon areas 1310 and 1320 each intersect the areas 1330, 1340, 1350 and 1360.

Figure 14:
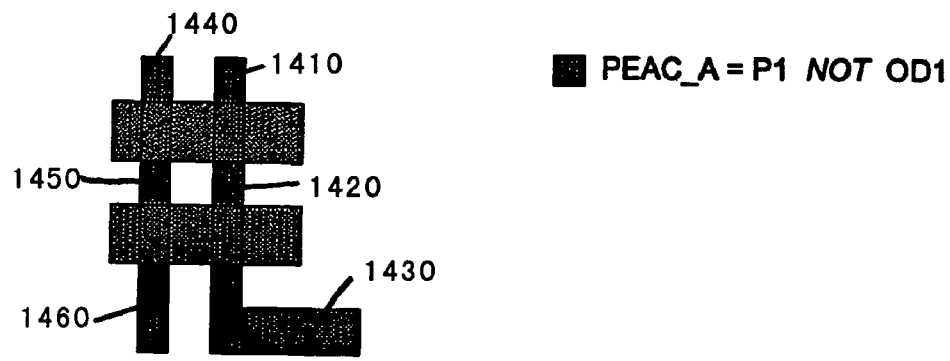

At the process 1220, extended areas without polysilicon areas below threshold are determined. FIGS. 14 and 15 are simplified diagrams for the process 1220 according to an embodiment of the present invention. This diagram is merely an example, which should not unduly limit the scope of the claims herein. As shown in FIG. 14, parts of extended areas excluding polysilicon areas are determined. For example, the extended areas without polysilicon areas include areas 1410, 1420, 1430, 1440, 1450 and 1460. As shown in FIG. 15, the areas 1410, 1420, 1430, 1440, 1450 and 1460 are compared with an area threshold. Among them, the areas 1410, 1420, 1440 and 1450 are smaller than the area threshold, and they are the extended areas without polysilicon areas below threshold.

At the process 1230, extended areas overlapping with polysilicon areas are determined. FIG. 16 is a simplified diagram for the process 1230 according to an embodiment of the present invention. This diagram is merely an example, which should not unduly limit the scope of the claims herein. The extended areas overlapping with polysilicon areas are areas 1610, 1620, 1630 and 1640. These areas 1610, 1620, 1630 and 1640 are parts of the extended areas 1350 and 1360 overlapping with the polysilicon areas 1310 and 1320. For example, the area 1610 overlaps with the polysilicon area 1310 and the extended area 1350.

At the process 1240, polysilicon areas for optical pattern compensation are determined. The polysilicon areas for optical pattern compensation are the extended areas without polysilicon areas below threshold that in contact with only one of the extended area overlapping with polysilicon areas. FIG. 17 is a simplified diagram for the process 1240 according to an embodiment of the present invention. This diagram is merely an example, which should not unduly limit the scope of the claims herein. The polysilicon areas for optical pattern compensation include the areas 1410 and 1440. For example, the area 1410 is in contact with the area 1610, not the areas 1620, 1630 and 1640. The area 1420 touches both the areas 1610 and 1620, and the area 1420 is not a polysilicon area for optical pattern compensation.

Figure 18:
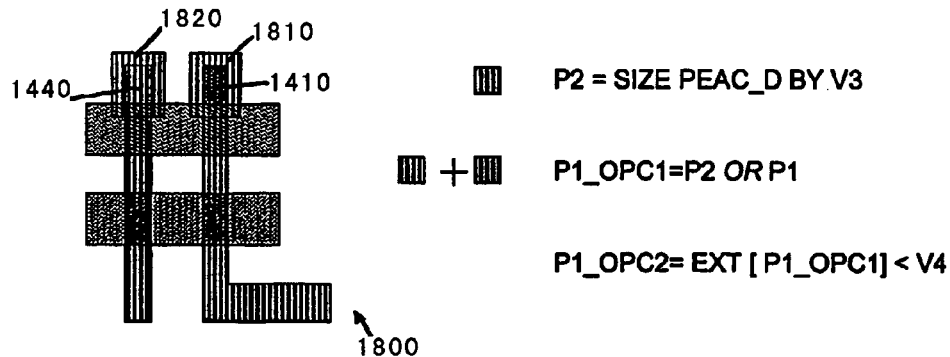
FIG. 18 is a simplified diagram for applying optical pattern compensation according to an embodiment of the present invention.

At the process 1250, an optical pattern compensation is applied. FIG. 18 is a simplified diagram for the process 1250 according to an embodiment of the present invention. This diagram is merely an example, which should not unduly limit the scope of the claims herein. The photolithographic mask 1800 includes optical pattern compensations 1810 and 1820 surrounding the areas 1810 and 1820 selected for optical pattern compensation. For example, the optical pattern compensation 1810 provides a protective layer with a certain width around the area 1410. The optical pattern compensations 1810 and 1820 are merged with the areas 1410 and 1440 respectively to form mask areas.

Figure 19:
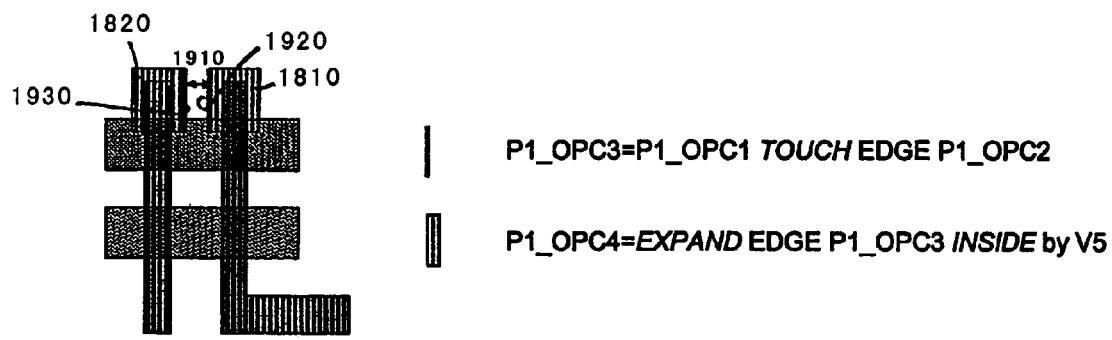
FIG. 19 is a simplified diagram for determining spacing according to an embodiment of the present invention.

At the process 1260, spacing between outer edges of mask areas is determined. For example, a distance between an outer edge of an optical pattern compensation and an outer edge of another optical pattern compensation is determined. As another example, a distance between an outer edge of an optical pattern compensation and an outer edge of the poly area is determined. If a distance is below a spacing threshold, the outer edge of the optical pattern compensation that is associated with the distance below the spacing threshold is selected. FIG. 19 is a simplified diagram for the process 1260 according to an embodiment of the present invention. These diagram are merely examples, which should not unduly limit the scope of the claims herein. A distance 1910 is measured from an outer edge 1920 of the optical pattern compensation 1810 to an outer edge 1930 of another optical pattern compensation 1820. If the distance 1910 is smaller than a spacing threshold, the outer edges 1920 and 1930 are selected.

Figure 20:
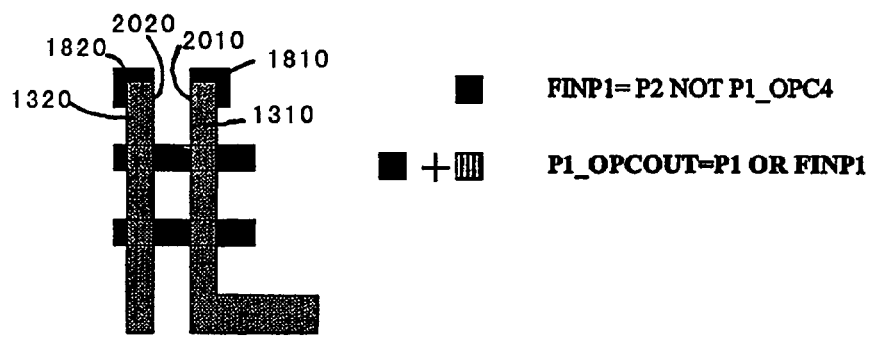
FIG. 20 is a simplified diagram for adjusting optical pattern compensation according to an embodiment of the present invention.

At the process 1270, an optical pattern compensation is adjusted if an distance associated with the optical pattern compensation is smaller than a spacing threshold. An outer edge previously selected and associated with the distance below the spacing threshold is adjusted so that the distance increases to meet or exceed the spacing threshold. FIG. 20 is a simplified diagram for the process 1270 according to an embodiment of the present invention. This diagram is merely an example, which should not unduly limit the scope of the claims herein. The outer edges 1920 and 1930 are adjusted towards outer edges 2010 and 2020 of the polysilicon areas 1310 and 1320 respectively. For example, the adjusted outer edges coincide with the edges 2010 and 2020 respectively. In another example, only one or neither of the adjusted outer edges coincides with the edges 1310 and 1320 respectively.

Figure 21:
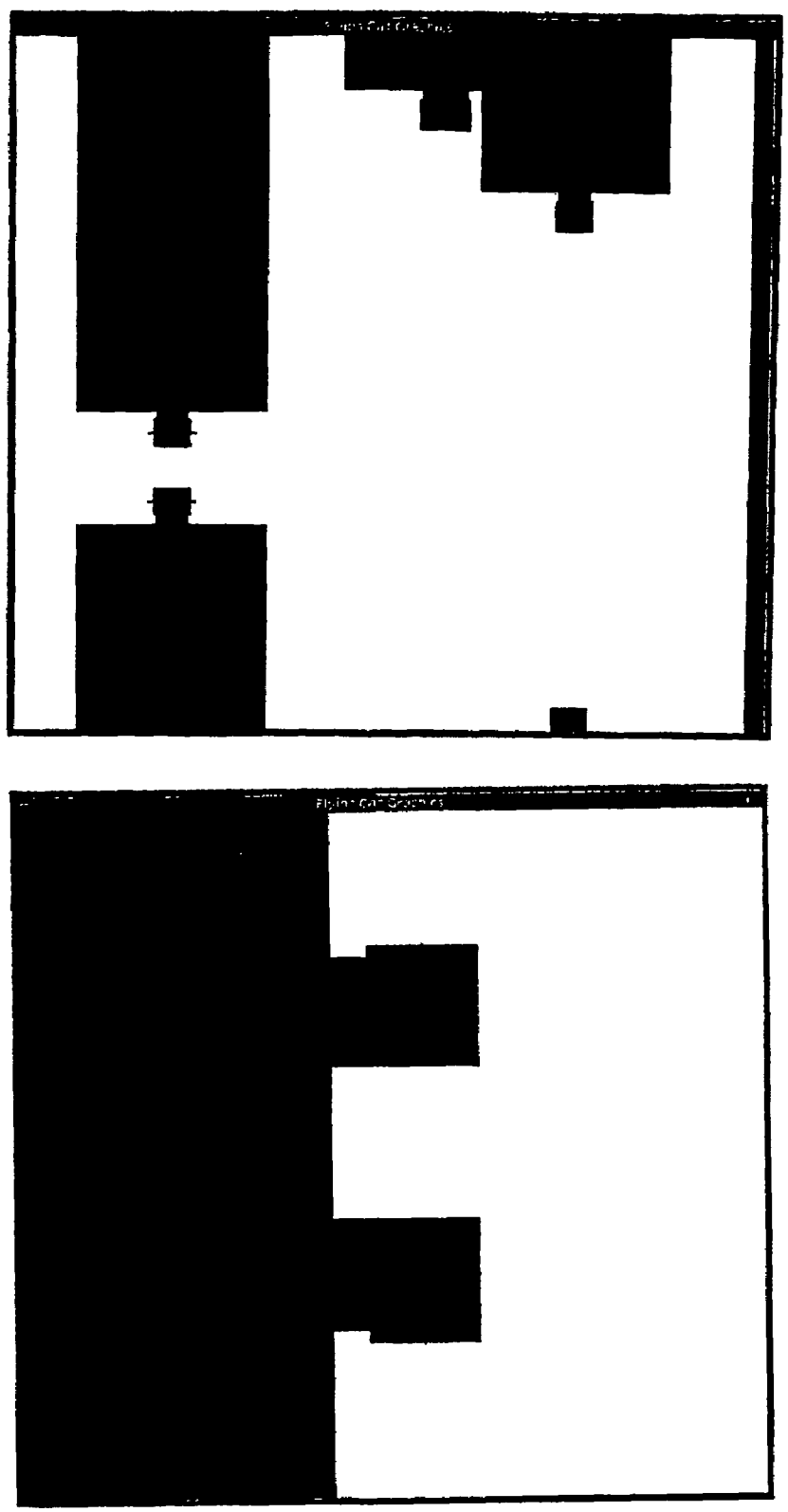
FIG. 21 is a simplified diagram for a photolithographic mask with optical pattern compensation according to another embodiment of the present invention.

As discussed above and further emphasized here, FIG. 12 is merely an example, which should not unduly limit the scope of the claims herein. An addition process for making an photolithography mask can also be performed. The photolithographic mask includes a polysilicon area and an optical pattern compensation. For example, the photolithographic mask includes the polysilicon area 1310 and the optical pattern compensation 1810. As another example, FIG. 21 is a simplified diagram for a photolithographic mask with optical pattern compensation according to another embodiment of the present invention. This diagram is merely an example, which should not unduly limit the scope of the claims herein.

Figure 22:
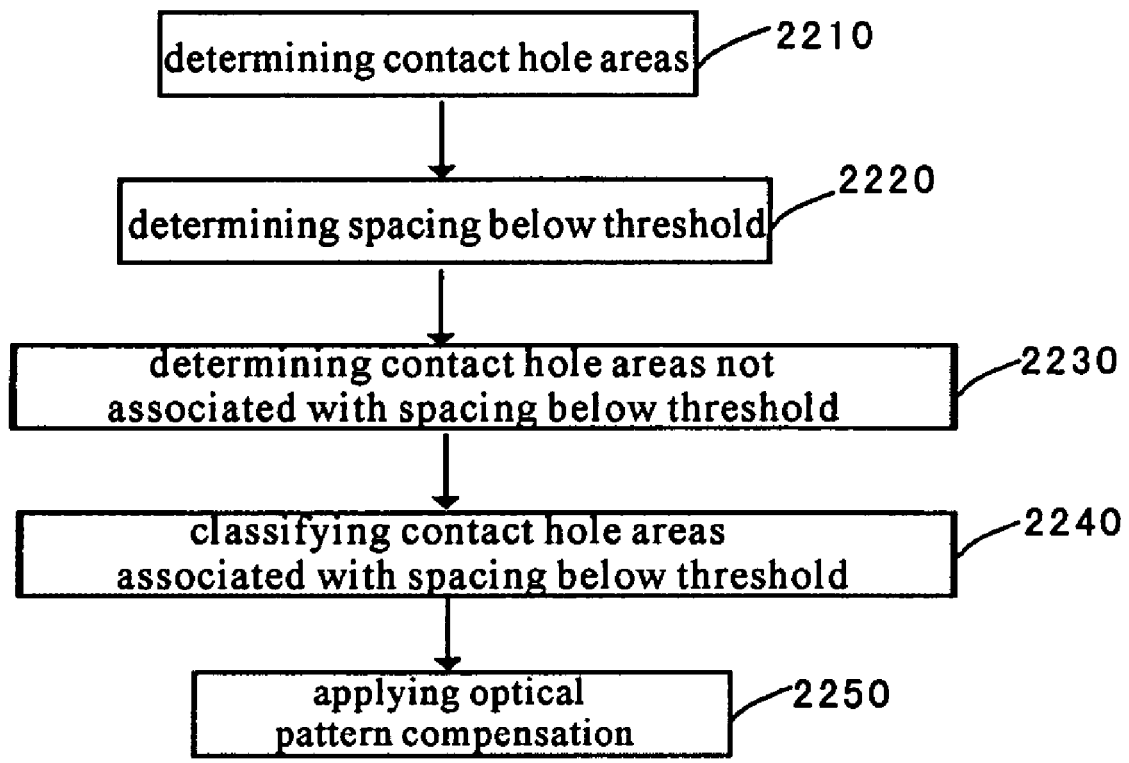
FIG. 22 is a simplified diagram of a method for optical pattern compensation according to yet another embodiment of the present invention.

FIG. 22 is a simplified diagram of a method for optical pattern compensation according to yet another embodiment of the present invention. This diagram is merely an example, which should not unduly limit the scope of the claims herein. The method 2200 includes the following processes:

1. Process 2210 for determining contact hole areas;
2. Process 2220 for determining spacing below threshold;
3. Process 2230 for determining contact hole areas not associated with spacing below threshold;
4. Process 2240 for classifying contact hole areas associated with spacing below threshold;
5. Process 2250 for applying optical pattern compensation.

The above sequence of processes provides a method according to an embodiment of the present invention. Other alternatives can also be provided where processes are added, one or more processes are removed, or one or more processes are provided in a different sequence without departing from the scope of the claims herein. Future details of the present invention can be found throughout the present specification and more particularly below.

Figure 23:
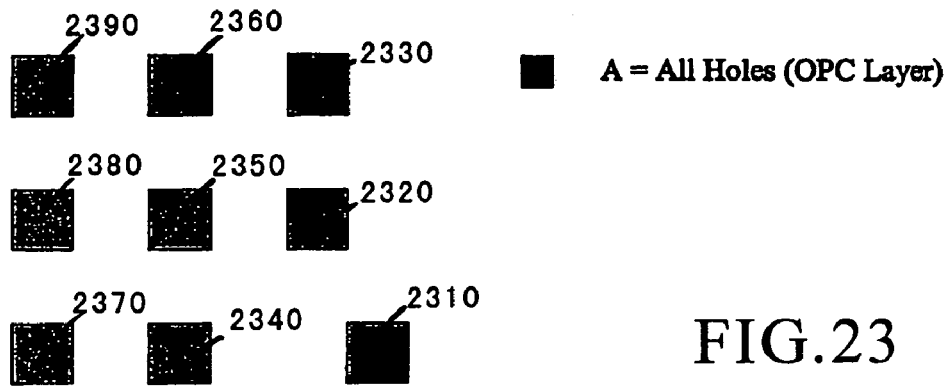
FIG. 23 is a simplified diagram for contact hole areas according to an embodiment of the present invention.

At the process 2210, contact hole areas are located. FIG. 23 is a simplified diagram for contact hole areas according to an embodiment of the present invention. This diagram is merely an example, which should not unduly limit the scope of the claims herein. The contact hole areas include areas 2310, 2320, 2330, 2340, 2350, 2360, 2370, 2380 and 2390.

Figure 24:
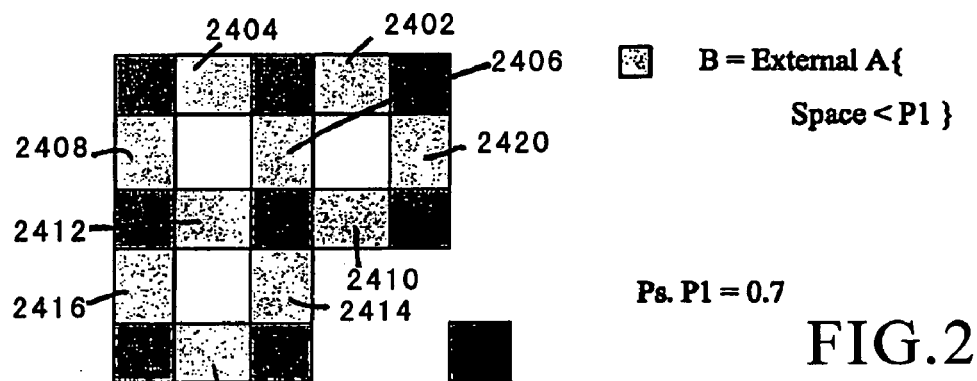
FIG. 24 is a simplified diagram for determining spacing below threshold according to an embodiment of the present invention.

At the process 2220, spacing below threshold is determined. A distance is measured between an outer edge of a contact hole area and an outer edge of another contact area. The distance is compared with a distance threshold. If the distance is smaller than the distance threshold, the distance is selected. FIG. 24 is a simplified diagram for the process 2220 according to an embodiment of the present invention. This diagram is merely an example, which should not unduly limit the scope of the claims herein. Areas 2402, 2404, 2408, 2410, 2412, 2414, 2416, 2418 and 2420 are associated with distances shorter than the distance threshold. For example, the distance threshold equals 0.7 µm.

Figure 25:
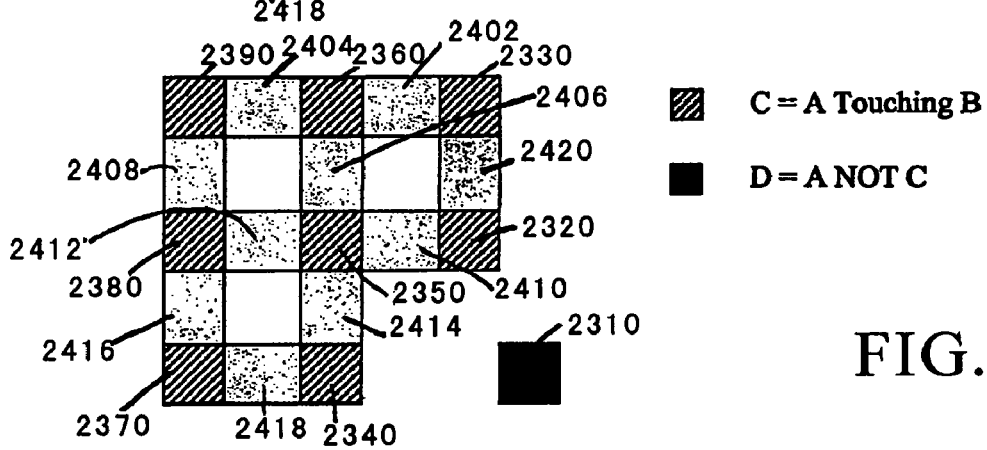
FIG. 25 is a simplified diagram for determining contact hole areas not associated with spacing below threshold according to an embodiment of the present invention.

At the process 2230, contact hole areas not associated with spacing below threshold are determined. FIG. 25 is a simplified diagram for the process 2230 according to an embodiment of the present invention. This diagram is merely an example, which should not unduly limit the scope of the claims herein. The contact hole areas 2320, 2330, 2340, 2350, 2360, 2370, 2380 and 2390 are in contact with at least one of the areas 2402, 2404, 2408, 2410, 2412, 2414, 2418 and 2420, and these contact hole areas are associated with spacing below threshold. For example, the contact hole area 2320 touches the areas 2410 and 2420. The area 2310 is not in contact with any of the areas 2402, 2404, 2408, 2410, 2412, 2414, 2418 and 2420, and the area 2310 is a contact hole area not associated with spacing below threshold.

Figure 26:
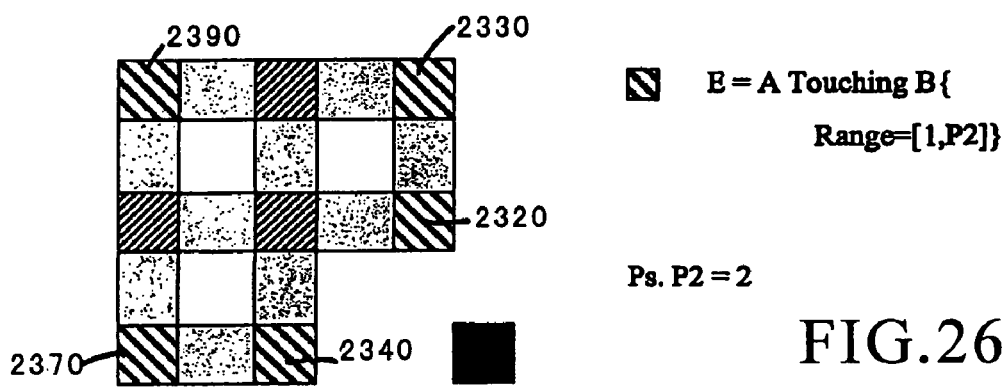
FIGS. 26 and 27 are simplified diagrams for classifying contact hole areas associated with spacing below threshold according to an embodiment of the present invention.
Figure 27:
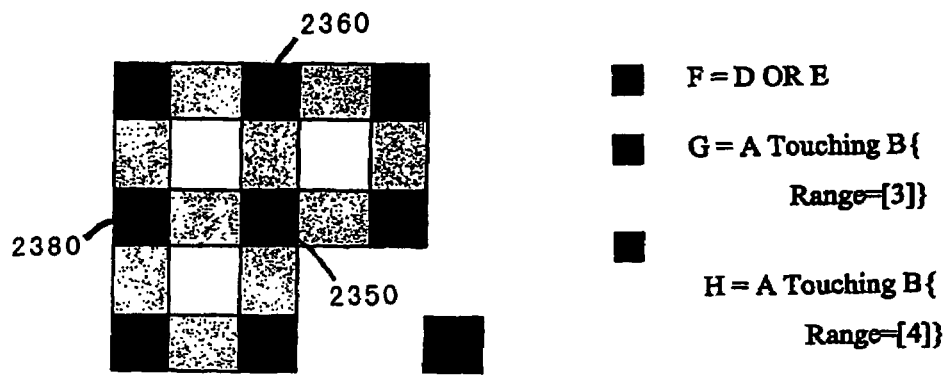

At the process 2240, contact hole areas associated with spacing below threshold is classified. For example, contact hole areas associated with spacing below threshold is classified into three categories A, B and C. The category A refers to the contact hole areas associated with one or two distances below threshold. The category B refers to the contact hole areas associated with three distances below threshold. The category C refers to the contact hole areas associated with four distances below threshold. FIGS. 26 and 27 are simplified diagrams for the process 2240 according to an embodiment of the present invention. These diagrams are merely examples, which should not unduly limit the scope of the claims herein. As shown in FIG. 26, the areas 2320, 2330, 2340, 2370 and 2390 belong to the category A. The areas 2360 and 2380 belong to the category B. The area 2350 belongs to the category C.

Figure 28:
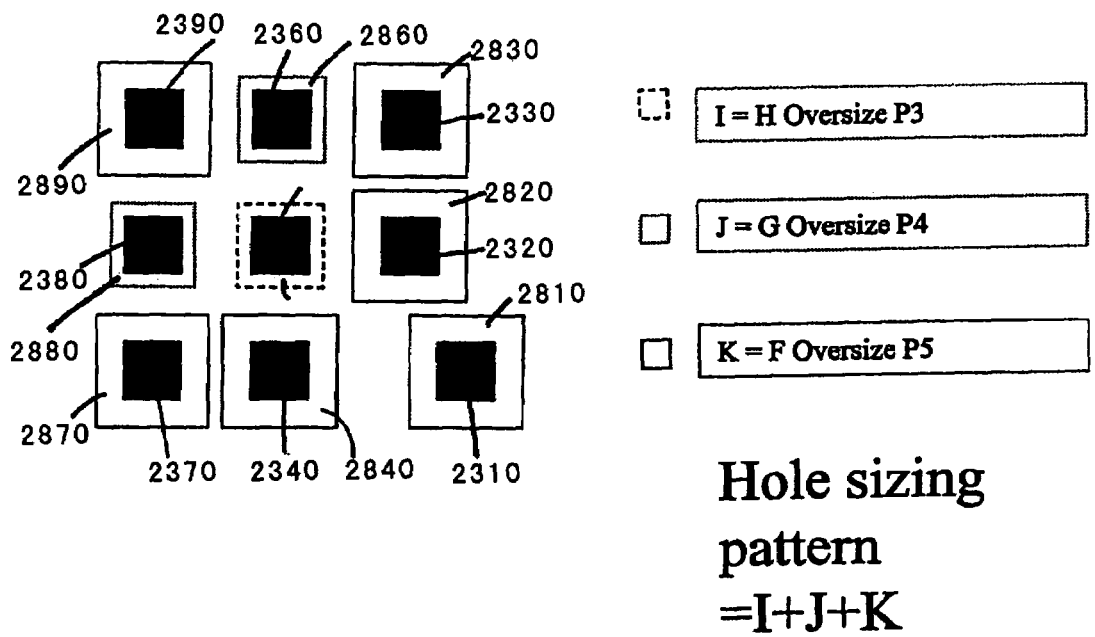
FIG. 28 is a simplified diagram for applying optical pattern compensation according to an embodiment of the present invention.

At the process 2250, an optical pattern compensation is applied. The optical pattern compensation for various types of contact hole areas may be different. FIG. 28 is a simplified diagram for the process 2250 according to an embodiment of the present invention. This diagram is merely an example, which should not unduly limit the scope of the claims herein. Optical pattern compensations of three types are applied, and the three types are labeled as D, E and F. Optical pattern compensations 2810, 2820, 2830, 2840, 2870 and 2890 of type D is applied to the contact hole area 2310 not associated with spacing below threshold and the contact hole areas 2320, 2330, 2340, 2370 and 2390 of category A respectively. Optical pattern compensations 2860 and 2880 of type E are applied to the contact hole areas 2360 and 2380 of category B. A optical compensation 2850 of type F is applied to the area 2350 of category C.

Figure 29:
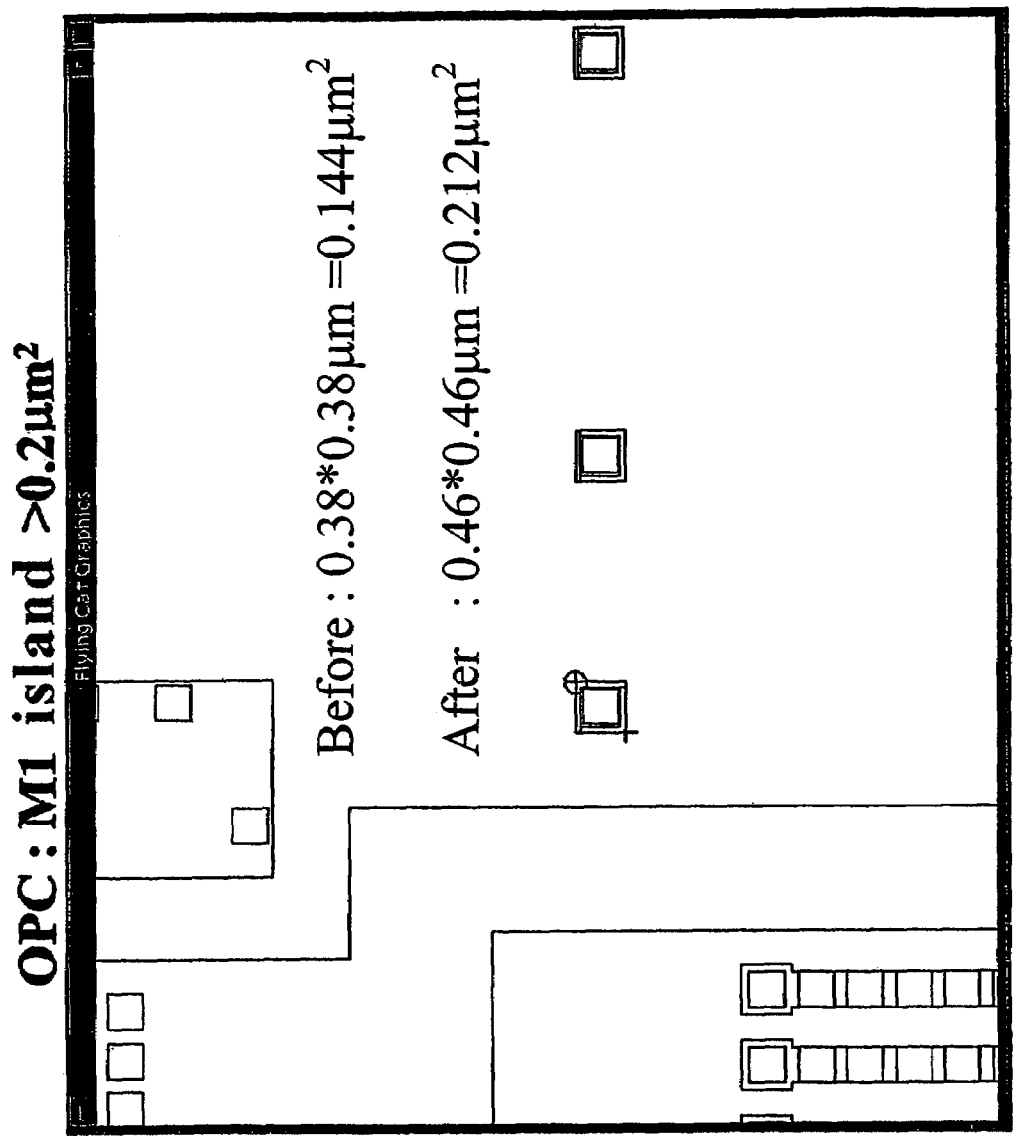
FIG. 29 is a simplified diagram for a photolithographic mask with optical pattern compensation according to yet another embodiment of the present invention.

As discussed above and further emphasized here, FIG. 22 is merely an example, which should not unduly limit the scope of the claims herein. An addition process for making an photolithography mask can also be performed. The photolithographic mask includes a contact hole area and an optical pattern compensation. For example, the photolithographic mask includes at least the contact hole area 2310 and the optical pattern compensation 2810. As another example, FIG. 29 is a simplified diagram for a photolithographic mask with optical pattern compensation according to yet another embodiment of the present invention. This diagram is merely an example, which should not unduly limit the scope of the claims herein.

The present invention has numerous advantages over conventional techniques. Certain embodiments of the present invention selectively apply optical pattern compensations and reduce the database volume for mask design. Some embodiments of the present invention automatically check the spacing between various mask areas and adjust optical pattern compensations accordingly. The computation requirement for detecting design rule violations is reduced. Certain embodiments of the present invention consider relationship between different layers to select areas for optical pattern compensation. For example, the layers include a metal layer and a via layer, or an active layer and a polysilicon layer. Some embodiments of the present invention provides different optical pattern compensations to different types of contact hole areas. Certain embodiments of the present invention reduce mask conversion and writing time.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for making a photographic mask, the method comprising:
   determining a first contact area;
   processing information associated with the first contact area;
   determining whether a first optical compensation should be applied to the first contact area based on at least information associated with the first contact area;
   if the first optical compensation should be applied to the first contact area,
      applying the first optical compensation to the first contact area;
      processing information associated with the first optical compensation;
      determining a first distance between the first optical compensation and a second optical compensation or a second contact area;
      processing information associated with the first distance;
      adjusting the first optical compensation based on at least information associated with the first distance,
   wherein the processing information associated with the first contact area comprises:
      determining at least a first distance from a first edge of the first contact area to a first boundary of a conductive area, a second distance from a second edge of the first contact area to a second boundary of the conductive area, and a third distance from a third edge of the first contact area to a third boundary of the conductive area;
      processing information associated with the first distance, the second distance, and the third distance;
      determining a first area associated with the first distance, a second area associated with the second distance, and a third area associated with the third distance;
   wherein the determining whether a first optical compensation should be applied to the first contact area is performed based on at least information associated with the first distance, the second distance, the third distance, the first area, the second area, and the third area.

2. The method of claim 1 wherein the processing information associated with the first to third distances comprises determining whether each of the first to third distances is smaller than a first distance threshold, and the processing information associated with the first to third areas comprises determining whether each of the first to third areas is smaller than an area threshold.

3. The method of claim 2 wherein the determining whether a first optical compensation should be applied to the first contact area comprises:
   determining whether each of the first to third distances is smaller than the first distance threshold and is free from being associated with one of the first to third areas smaller than the area threshold;
   determining whether the first contact area is associated with at least three of the first to third distances smaller than the first distance threshold and free from being associated with one of the first to third areas smaller than the area threshold.

4. The method of claim 3 wherein the first to third areas comprise at least boundaries being away from each other by the first to third distances.

5. The method of claim 1 wherein the processing information associated with the first distance comprises determining whether the first distance is smaller than a second threshold distance.

6. The method of claim 1 wherein the adjusting the first optical compensation based on at least information associated with the first distance comprises adjusting the first optical compensation only if the first distance is smaller than the second threshold distance.

7. The method of claim 1 wherein the first optical pattern compensation surrounds the first contact area with a compensation width.

8. The method of claim 1, and further comprising making a photolithographic mask, the photolithographic mask including a conductive area and a first optical pattern compensation.

* * * * *